United States Patent [19]

Bowman et al.

[11] Patent Number: 4,906,196
[45] Date of Patent: Mar. 6, 1990

[54] NETWORK DISTRIBUTION ASSEMBLY

[75] Inventors: Gary W. Bowman, Lexington; Edward K. Marsh, Kernersville, both of N.C.

[73] Assignee: AMP Incorporated, Harrisburg, Pa.

[21] Appl. No.: 326,486

[22] Filed: Mar. 20, 1989

Related U.S. Application Data

[63] Continuation of Ser. No. 159,877, Feb. 24, 1988, abandoned.

[51] Int. Cl.[4] .............................................. H01R 9/09
[52] U.S. Cl. ...................................... 439/76; 439/92; 439/55; 439/457
[58] Field of Search ....................... 439/55, 76, 78, 81, 439/92, 95, 96, 457, 536, 537, 629

[56] References Cited

U.S. PATENT DOCUMENTS

| | | | |
|---|---|---|---|
| 4,595,799 | 6/1986 | Krob et al. | 439/55 |
| 4,641,900 | 2/1987 | Japngie | 439/76 |
| 4,749,370 | 6/1988 | Moser et al. | 439/460 |
| 4,753,606 | 6/1988 | DeLuca et al. | 439/457 |
| 4,767,338 | 8/1988 | Dennis et al. | 439/55 |
| 4,773,867 | 9/1988 | Keller et al. | 439/49 |

OTHER PUBLICATIONS

"Shielded Modular Jacks and Plugs", AMP Incorporated, 1987.
"AMPIX Modular Cross-Connect System for Premises Information (Voice/Data)" AMP Incorporated, 1986.
"AMP Modular Premises Information Cross-Connect System (AMPIX*)" AMP Incorporated Instruction Sheet IS3185 (Released 10-1-86).

Primary Examiner—P. Austin Bradley
Attorney, Agent, or Firm—Eric J. Gron

[57] ABSTRACT

A network interface for use with shielded data cable includes an insulative base member, a printed circuit board assembly and an insulative cover member, the printed circuit board assembly being insertable within the base member with the cover member being receivable over the insulative base and printed circuit board assembly. The printed circuit board assembly includes a plurality of shielded modular jacks disposed along a front edge of the printed circuit board. The shield members are interconnected to ground tabs at a rear edge of the printed circuit board via ground traces disposed on the printed circuit board. The terminals within the modular jacks are each interconnected to an electrical terminal IDC post via electrical traces on the printed circuit board. Shielded data cable is interconnectable to the interface with the shielding braid of the data cable dressed over the cable insulation and insertable within a resilient contact portion of the grounding clip.

12 Claims, 13 Drawing Sheets

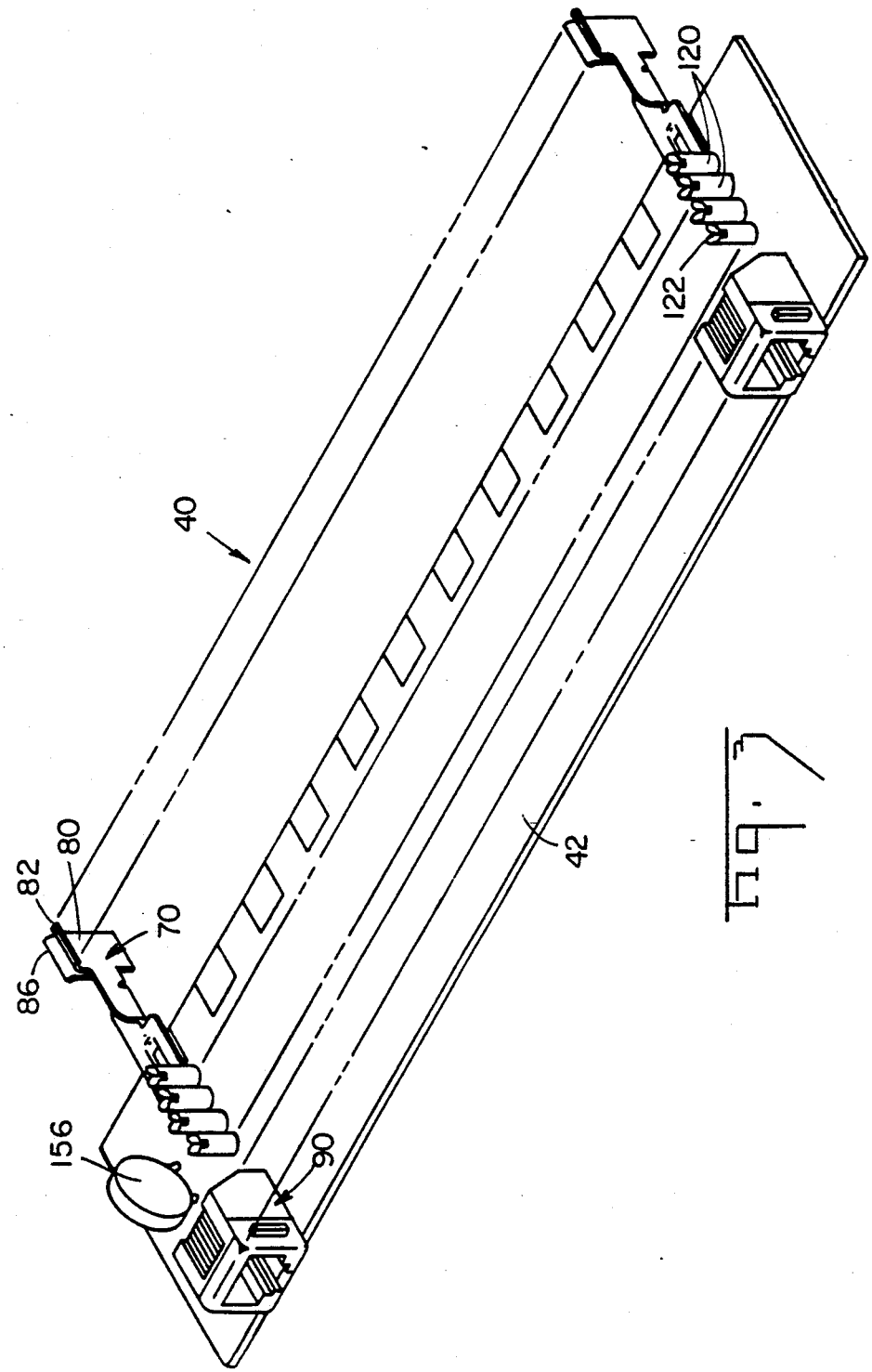

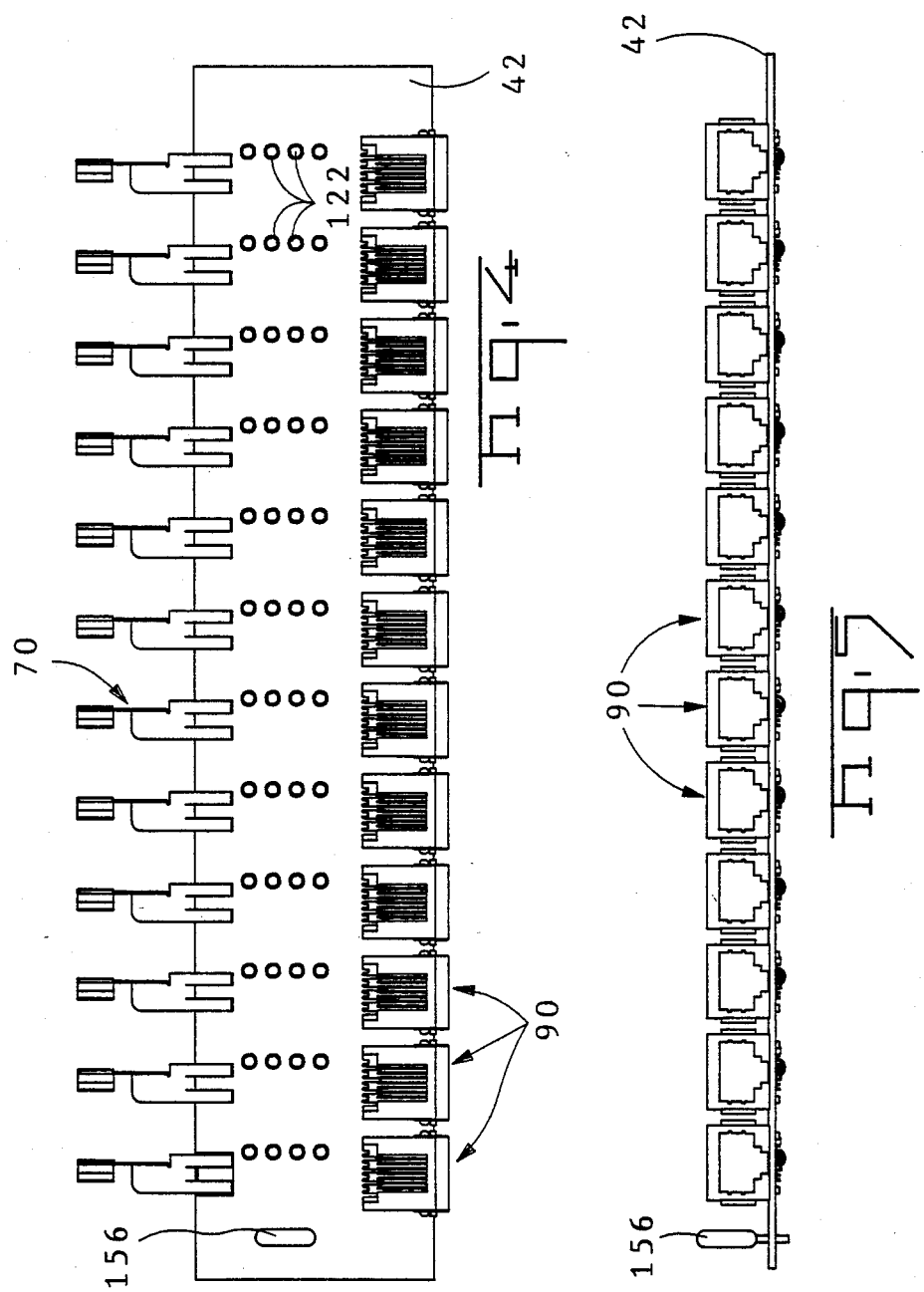

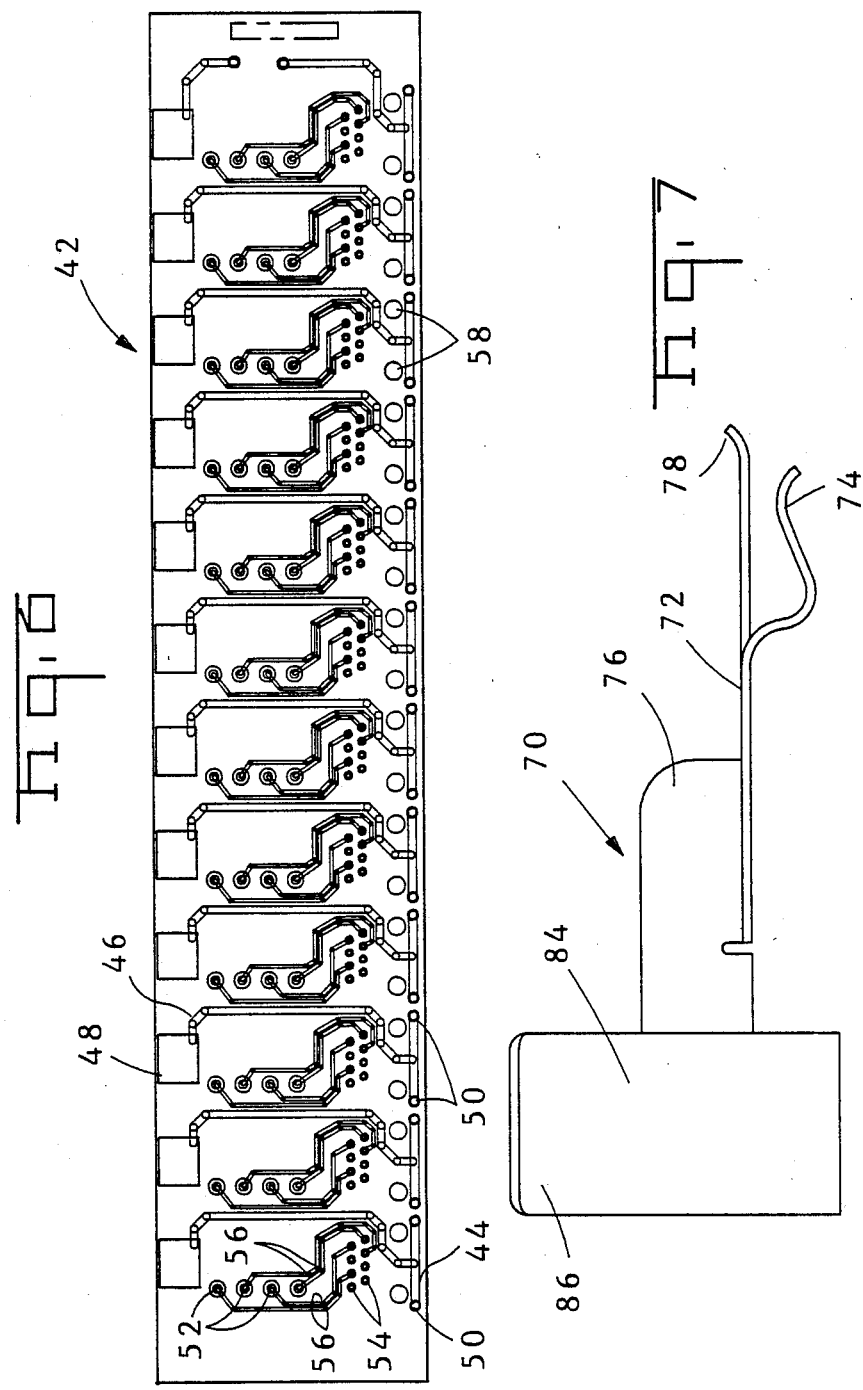

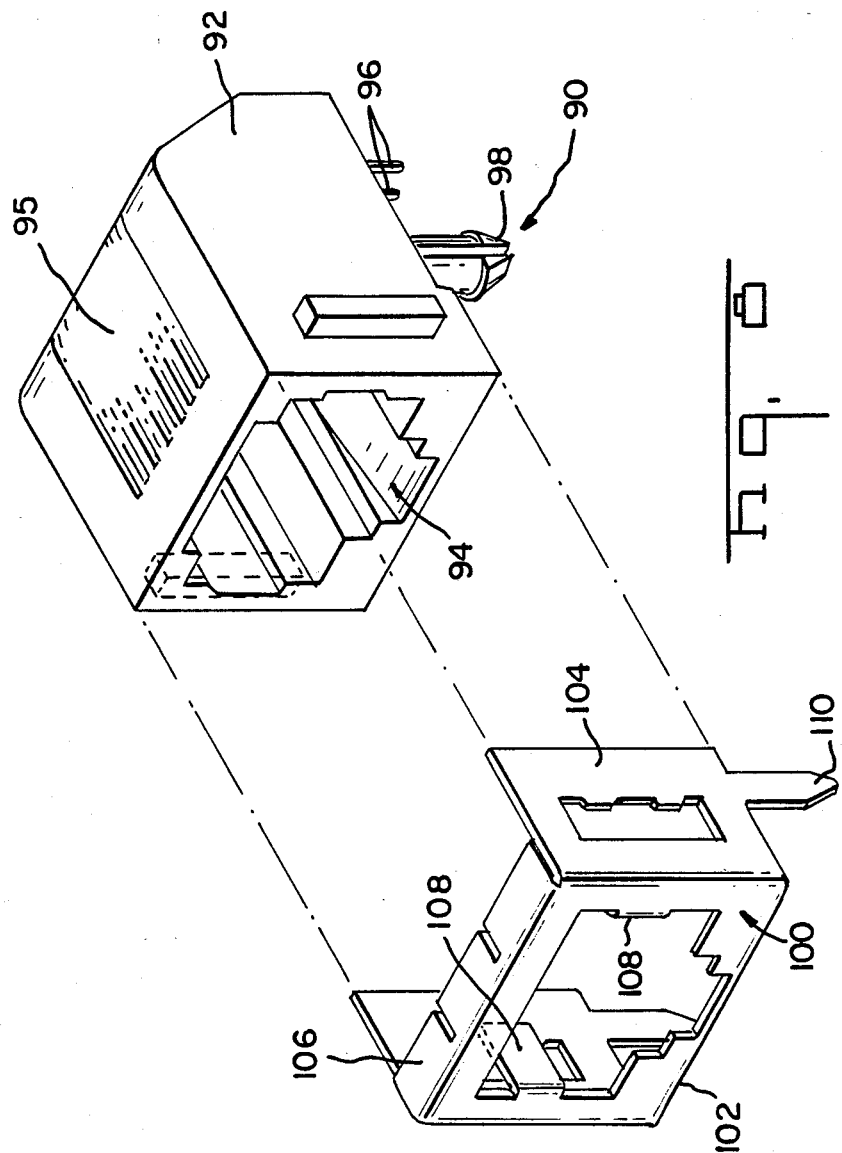

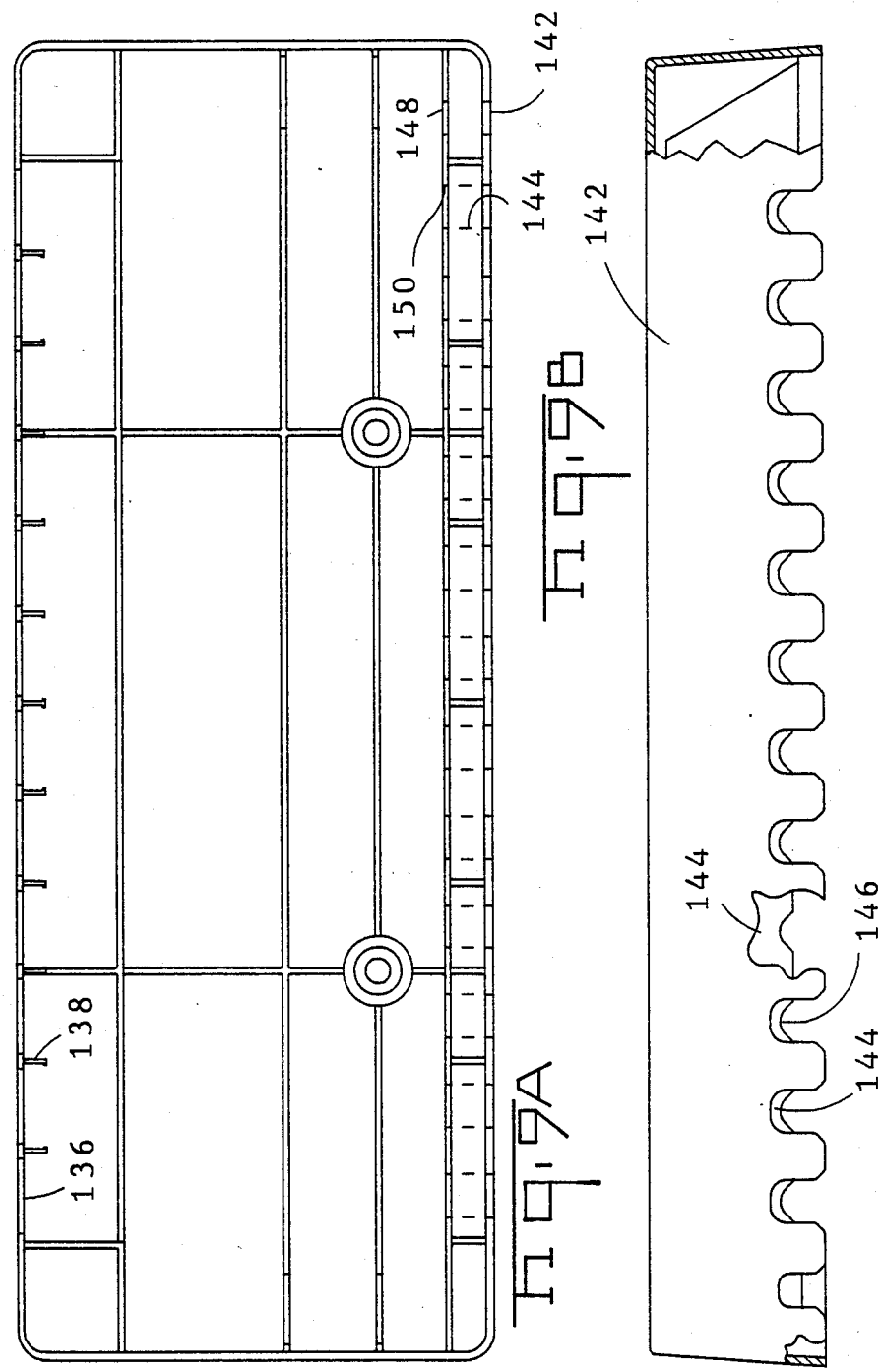

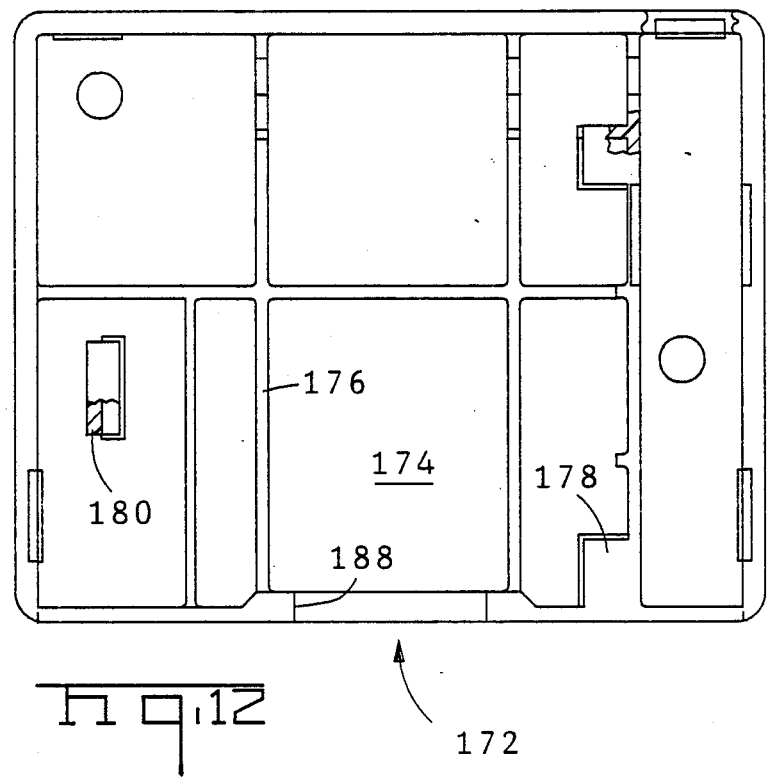
Fig. 12
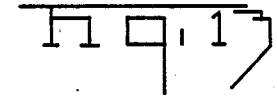
Fig. 13
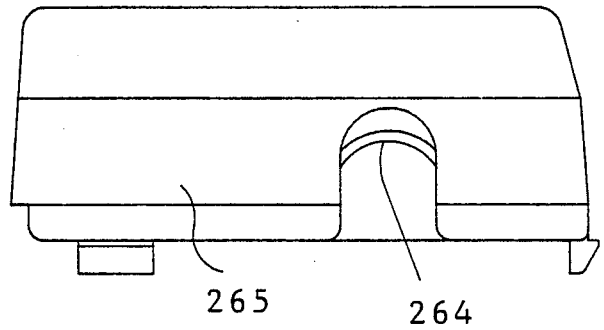

NETWORK DISTRIBUTION ASSEMBLY

This application is a continuation of application Ser. No. 07/159,877 filed Feb. 24, 1988, now abandoned.

BACKGROUND OF THE INVENTION

1. Field of the Invention

The subject invention relates to a data distribution assembly and more particularly to an assembly employing a plurality of shielded modular jacks for use with shielded data cable.

2. Description of the Prior Art

U.S. Pat. No. 4,501,459 discloses a local area network connector specifically intended for use in the data communications industry. These connectors can be employed in a closed loop data communications link in which various equipment such as computer terminals can be interconnected in a system. These connectors are specifically adapted for use in interconnecting numerous micro or mini computers in a computer network in an office environment. Connectors of this type have standard interface dimensions and configurations. These connectors must also be shielded to prevent spurious electrical signals and noise from affecting the signals in the network.

The structure and components of local area network connectors of this type is represented by the structure of the connector shown in U.S. Pat. No. 4,501,459. These connectors include a plurality of spring metal terminals having insulation displacement wire barrels for establishing electrical connection with the individual conductors forming the multi conductor shielded cable. Terminals are positioned on a support housing and upper and lower shields can be positioned in surrounding relationship to the terminals and the support housing. Shield members are permanently attached to upper and lower cover members and the cover members are mated to both encapsulate the conductor and to common the upper and lower shields to the cable shielding.

Similar data connectors of this type are shown in U.S. Pat. Nos. 4,449,778; 4,508,415; 4,582,376; 4,602,833; 4,619,494; 4,653,825; 4,641,906; 4,671,599; and 4,682,836.

These above mentioned connectors are utilized with data distribution systems where the various distribution end points are subject to change. For example, several computer terminals could be interconnected to various associated printing stations. If the data cable is continuous between a first point, which could be a terminal, and between a second end, which could be a printing station, the cable would have to be severed at some position within the cable length to interconnect one terminal to a different printing station.

For this reason, data distribution panels are incorporated within the system acting as links to the various end points. These panels are located intermediate the destinations, typically in a wiring closet, and include shielded cable coming from one destination, such as a terminal, which is terminated to an electrical connector and mounted within a panel. A second shielded cable coming from a second destination, such as from a printing station, is interconnected to a second electrical connector and the second electrical connector is mounted within the panel adjacent to the first electrical connector. A patch cable is utilized which includes a short length of shielded data cable having two electrical connectors at opposite ends which are matable with the first and second electrical connectors mounted within the panel. In all likelihood, a mass array of first electrical connectors and a mass array of second electrical connectors are disposed in a matrix and mounted to the panel. Several patch cables are available to change and interconnect, the various interconnections possible between the first and second connectors.

A shortcoming of these distribution systems is the cost, complexity and space required to physically accommodate the system, especially so when the capabilities of such an elaborate system are not required. For example, the above-mentioned data distribution systems and connection systems can handle speeds of up to 16 megahertz. However, if a slower system is desired, then the above-mentioned system can be undesirable from the costing standpoint alone.

Other cross-connect equipment which presently exists within the telephone industry is quite cost effective, as modular telephone plugs and jacks are employed, which can be quite simplistic in design, offering a reduction in price over more sophisticated connectors. However, the cross-connect equipment which is presently available is for use with standard twisted pair telephone cable, not shielded data cable.

Therefore, a need exists within the industry for a more cost effective data distribution system which is capable for use in the ranges of 1–4 megahertz.

SUMMARY OF THE INVENTION

The object of the invention relate to reducing the overall cost of this type of installation by first reducing the cost of the components which are included within the system, and by reducing the labor intensity of installing the equipment.

The object of the invention relates to utilizing a modular jack/modular plug connector system with shielded data cable to form a shielded data distribution system.

The object of the invention relates to designing an intermediate speed capability within the data distribution industry which is capable for use within the ranges of 1–4 megahertz.

Given the above objectives, the preferred embodiment of the invention includes a data distribution network interface which is usable with shielded data cable and includes an insulative base member having a front face and a wire entry face, and latching and positioning means to position a printed circuit board assembly to the base member and latch said circuit board assembly thereto. The printed circuit board assembly includes a printed circuit board having a first edge which is adjacent to the front face of the base member and a second edge which includes at least one ground tab disposed on the printed circuit board which is continuous with the grounding trace extending towards the first edge of the printed circuit board. The printed circuit board assembly further includes at least one shielded modular jack positioned on the printed circuit board with a plug receiving opening on the modular jack facing the front face of the insulative base member. The modular jack has a plurality of electrical contacts interconnected to the printed circuit board and a shield member which is interconnected to the ground trace. A plurality of electrical terminals positioned on the printed circuit board are electrically interconnected to respective electrical contacts of the modular jacks via electrical traces which are disposed on the printed circuit board. The printed circuit board assembly further comprises grounding means interconnected to the printed circuit board and electrically interconnected to the grounding tab, thereby interconnecting the shield member of the modular jack to the grounding means. The interface also includes an insulative cover member positionable over the insulative base member to enclose the printed circuit board assembly.

In the preferred embodiment of the invention, the interface grounding means includes a grounding clip having a first resilient contact portion which is receivable over the second edge to contact the grounding tab. The grounding means further includes a second resilient contact portion for receiving a shielded data cable therein. In this manner, the shielded data cable is prepared by stripping a portion of the insulation away from an end to be prepared and a shielding braid of the shielded cable is dressed over the insulation, the prepared end of the cable is insertable into the second resilient contact portion to interconnect the shielding braid of the cable to the shield member of the shielded modular jack.

BRIEF DESCRIPTION OF THE DRAWINGS

FIG. 3 shows the printed circuit assembly shown in FIG. 1.

FIG. 4 shows a top plan view of the printed circuit assembly shown in FIG. 3.

FIG. 5 shows a front plan view of the printed circuit board assembly of FIG. 3.

FIG. 6 shows a bottom plan view of the printed circuit board of the printed circuit board assembly of FIG. 3.

FIG. 7 shows a side plan view of the grounding clip of the printed circuit board assembly shown in FIG. 3.

FIG. 8 shows a three dimensional view of the shielded modular jack which is shown in the printed circuit board assembly of FIG. 3.

FIG. 9A is a bottom plan view of the cover shown in FIG. 1.

FIG. 9B is a rear plan view of the cover shown in FIG. 9A.

FIG. 12 shows a top plan view of the base member of FIG. 11.

FIG. 13 shows a side plan view of the cover of FIG. 11.

DETAILED DESCRIPTION OF THE PREFERRED EMBODIMENT

Figure 1:
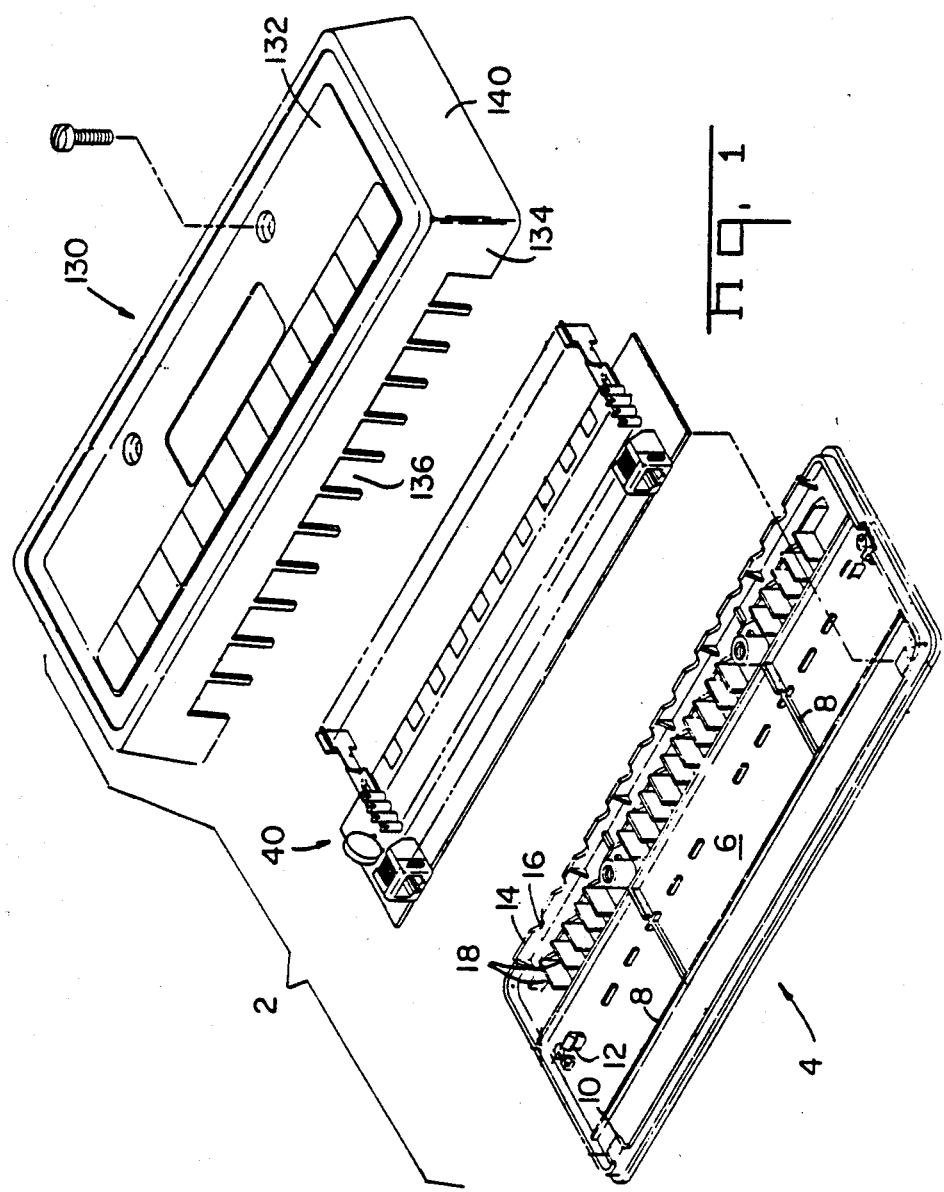
FIG. 1 is the network distribution assembly of the instant invention.
Figure 2:
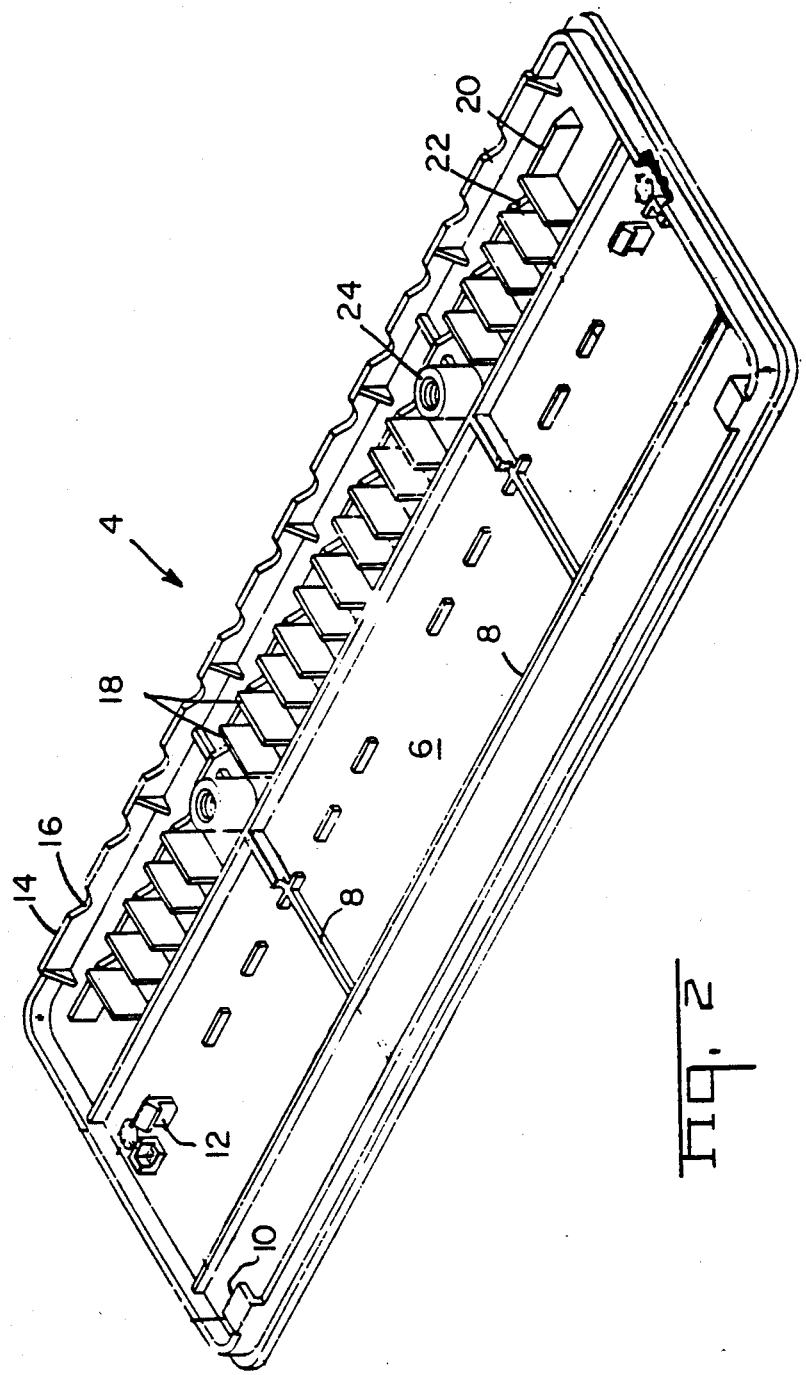
FIG. 2 shows the base member of the assembly shown in FIG. 1.

Referring first to FIG. 1, the subject invention includes a data distribution junction box 2 which generally comprises an insulating base member 4, a printed circuit board assembly 40, and an insulative cover member 130. As shown in FIG. 2, the insulative base member 4 includes a floor, such as 6, having a plurality of intersecting webs, such as 8, which are integral with the housing member and are formed with an upper edge in a uniplanar fashion to form a platform for the receipt of a printed circuit board. The forward edge of the insulative base member includes two integral steps 10 which project inwardly towards the center of the base member and which are cooperable with two latch members 12 to latchably engage with a printed circuit board to latchably attach the board thereto. The rear wall 14 of the base member 4 includes a plurality of receiving recesses, such as 16, which are generally in alignment with recesses 22 of inner wall member 20. The insulative base member further comprises a plurality of upstanding partitions, such as 18, which flank the aligned recesses 16 and 22 to form cable receiving channels within the base member 4. The base member 4 also includes threaded boss members, such as 24, which upstand from the floor 6 to form attachment members with a complementary cover.

With reference now to FIG. 3, the printed circuit board assembly 40 generally comprises an insulating substrate or printed circuit board, such as 42, which deploys a plurality of shielded receptacles, typically referred to as modular jacks, along a front longitudinal edge of the printed circuit board, as shown in FIGS. 4 and 5. The printed circuit board assembly further comprises a plurality of barrel terminals, such as 122, and a plurality of grounding clips, such as 70. FIG. 6 is a lower plan view of the printed circuit board 42 which includes a plurality of through holes, such as 50, for mounting the shielded modular jacks thereto, with the through holes 50 including a commoning trace 44 between each pair of through holes 50. The printed circuit board further includes grounding pads 48 along a rear edge of the printed circuit board with a ground trace, such as 46, interconnecting the grounding pad 48 with the grounding trace 44. The printed circuit board 42 further includes a plurality of through holes, such as 52, which electrically interconnect the barrel terminals to respective electrical through holes 54 via conductive traces 56. Apertures 58, which extend through the printed circuit board, are located relative to each of the electrical traces and are positioned for mounting the modular jacks onto the printed circuit board. The printed circuit board assembly 40 could also include such components as capacitors 156.

The printed circuit board assembly is shown in FIGS. 3 and 4 as including a plurality of grounding clips 70. As shown in FIG. 7, the grounding clips 70 include a base plate, such as 72, which lies in the plane of the original plate with an arm portion 76 which is formed tangentially of the base plate 72 which is integral with a first plate 80 and further comprises a second plate 84 (FIG. 7) which is folded over about plate 80 to form two parallel plates, the two plates defining a resilient contact. The ends of each plate include a flared out portion 82 (FIG. 3) and a portion 86 (FIG. 7) to form a lead in section for a shielded braid of a shielded cable. The grounding clip 70 further includes, extending from a front edge thereof, two fingers 78 which are generally uniplanar with the base portion 72 and a portion 74 which is stamped intermediate the two fingers 78 and formed into a resilient finger, such as 74.

The printed circuit board assembly 40, as shown in FIG. 1, further comprises a plurality of shielded modular jacks 90, shown in FIG. 8 as generally including an insulating housing 92 having, at the front thereof, a plug receiving opening 94 which opens into the cavity including reversely bent electrical contacts (not shown). The terminals are then disposed in channels 95 on the upper part of the insulating housing 92 and extend downwardly to form printed circuit board interconnections 96 from the lower base of the insulating housing 92. The shielded modular jack 90 further includes a shielded member 100 which includes a face plate portion 102 which abuts the front face of the insulating housing 92 and includes side flaps 104 which fold about the side walls of the insulating housing 92. Each of the side flaps 104 comprises a grounding tab 110 extending from a lower edge of the side flap. The face plate portion 102 includes two resilient tabs 108 extending obliquely into the plug receiving opening 94 and includes a tab 106 which extends obliquely from the upper edge of the shielding face plate 102.

As shown in FIG. 1, the upper cover 130 includes an upper wall 132, a front wall 134, side walls 140, and a rear wall 142 (FIG. 9A). The front wall 134 is subdivided into a plurality of openings 136 to surround the plurality of shielded modular jacks on the printed circuit board assembly 40. With reference to FIG. 9A, the cover 130 is shown in bottom plan view and shows integral ribs 138 integral with each section which forms the openings 136 to add to the integrity of that section. The rear wall 142 is shown as including a plurality of recesses 144 which are aligned with a plurality of recesses 150 in an inner wall 148. FIG. 9B shows a rear plan view of the cover 130 and shows that the edge of the recess 146 is at a lower height than the edge of the recess 144. The two parallel walls 142 and 148 are spaced to trap between them the rear wall 14 of the base member 4, as shown in FIG. 2. In this manner, the three walls 142, 148 and 14 cooperatively form a strain relief when a cable is placed between the covers and the walls are moved in vertical registration.

Figure 11:
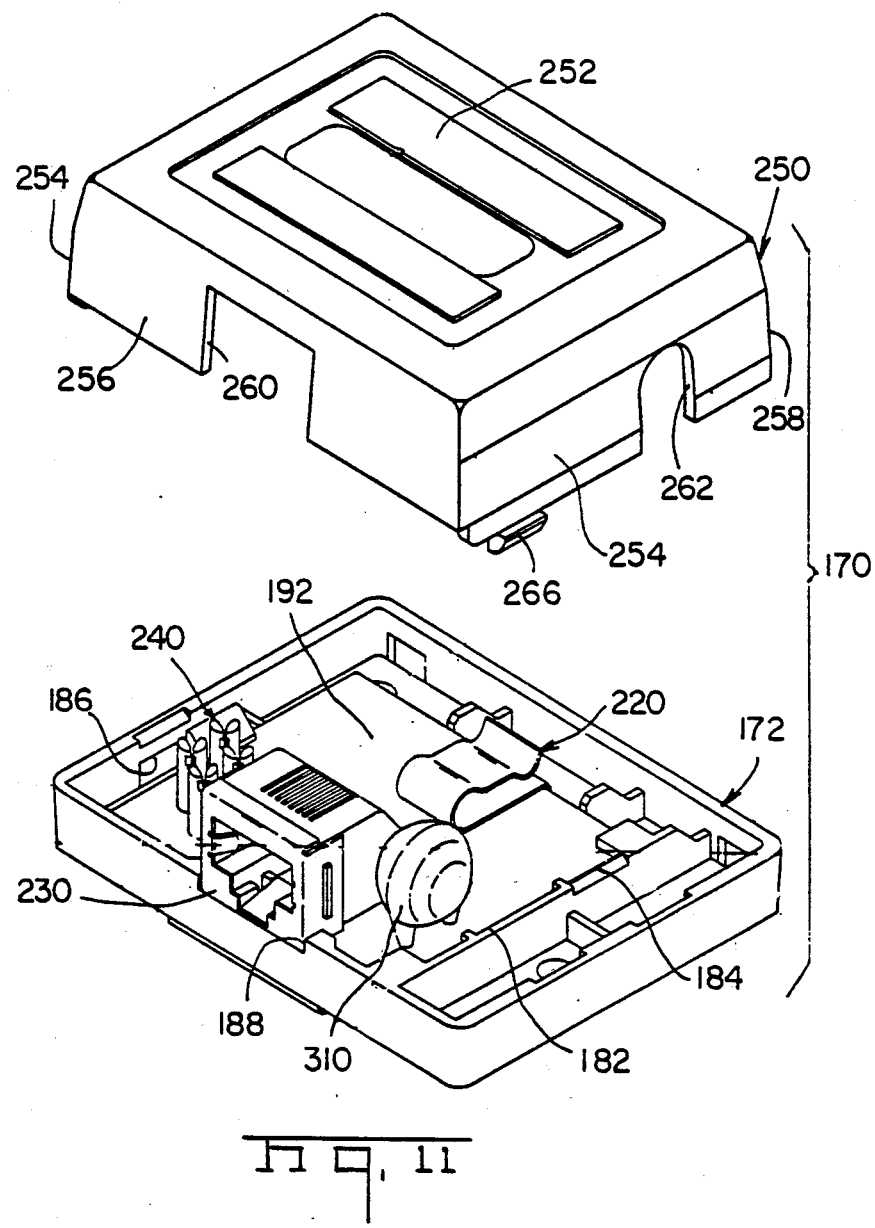
FIG. 11 is a three dimensional view of the local data distribution outlet.
Figure 16:
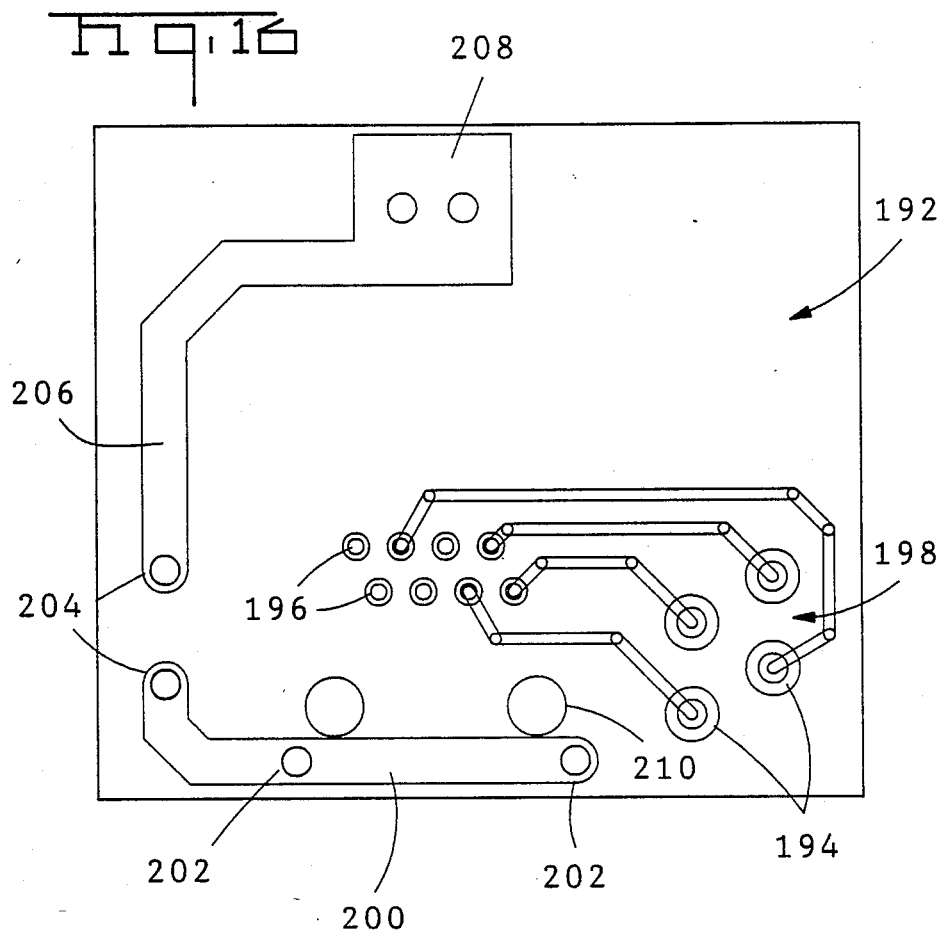
FIG. 16 is a bottom plan view of the printed circuit board shown in FIG. 14.

A local data distribution outlet is shown as 170 in FIG. 11 and generally includes a base member 172, a printed circuit board assembly 192, and an upper cover 250. As shown in FIG. 12, the insulative base member includes a base surface 174 with a plurality of integral ribs 176 upstanding from the base surface to form a platform for receipt of a printed circuit board. The insulative base member 172 further includes plate members 178 which are integral with the ribs 176 and, together with latch members 180, form complementary latching means for a printed circuit board. As shown in FIG. 11, the insulative housing member 172 further includes an inner wall 182 which is parallel with a side wall and includes an upper edge portion 184 which acts as a strain relief for a cable which is inserted within the housing. As shown in FIG. 11 and FIG. 12 the insulative base member 172 further includes an opening 188 for receipt of at least a portion of a shielded modular jack 230. With reference to FIG. 16, the printed circuit board 192 includes a plurality of through holes 194 and a plurality of through holes 196 which are selectively interconnected via conductive traces, such as 198. The printed circuit board 192 further includes two apertures 202 which are disposed at a front edge of the printed circuit board which are electrically interconnected via an electrical trace 200. Printed circuit board 192 also includes two through holes 204 and a conductive pad 208, the conductive pad 208 being electrically commoned to one of the through holes 204 via a conductive trace 206 and the other through hole 204 being electrically interconnected to the through holes 202 via the trace 200. A capacitor 310 (FIG. 11) is installed within the through holes 204 and is soldered in place. As shown in FIG. 11, a shielded modular jack 230 is installed on the printed circuit board 192 and the modular jack 230 is identical to the shielded modular jack 90 shown in FIG. 8. Thus, the modular jack includes retention features to engage in apertures 210 and includes grounding tabs which are electrically interconnected to the conductive through holes 202.

Figure 15:
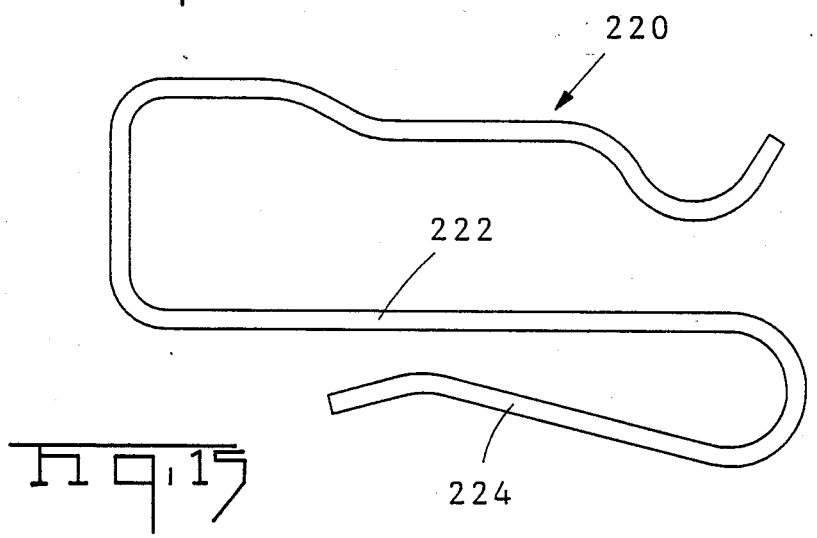
FIG. 15 is a side plan view of the grounding clip shown in FIG. 14.

A ground clip, as shown in FIG. 15, is electrically interconnected to the grounding pad 208 of FIG. 16, and the grounding clip 220 generally includes a base portion 222 with a folded clip member 224 which is slidably receivable over the printed circuit board to contact the grounding pad 208. As shown in FIG. 11, barrel terminals 240 are electrically interconnected to plated through holes 194 and are then electrically interconnected to the electrical terminals of the modular jack 230 via the conductive traces 198. As shown in FIG. 11, an insulating cover 250 includes an upper wall 252, side walls 254, a front wall 256, and a rear wall 258. The front wall 256 includes an opening 260 which is complementary with opening 188 to surround the periphery of the modular jack 230. Side wall 254 includes a cable opening 262 which, as shown in FIG. 13, is in alignment with a recess 264 of an inner wall 265. The insulating cover 250 is snap latchable to the insulative base member 172 via latches 266 snapping into shoulders 186.

Figure 10:
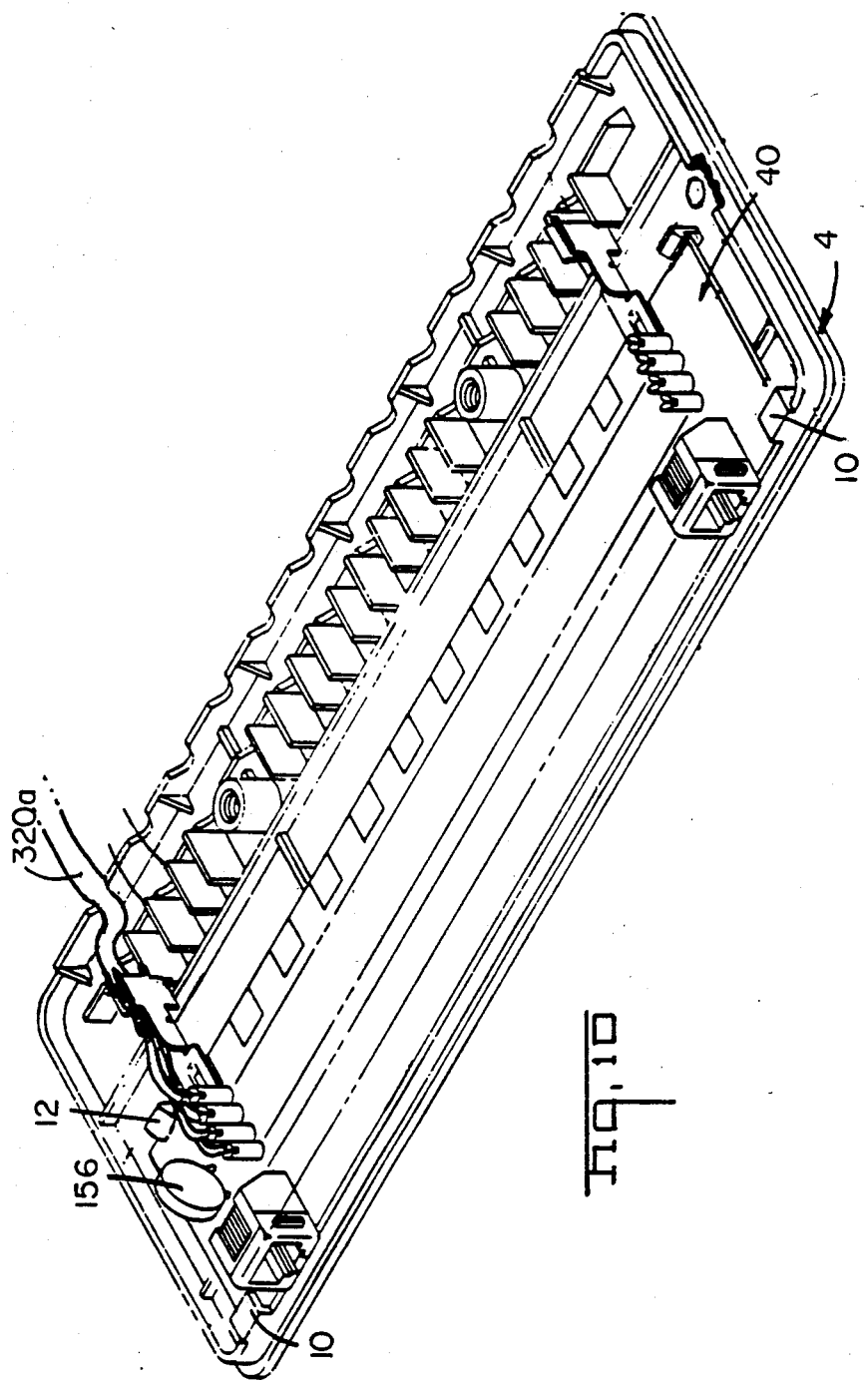
FIG. 10 shows the printed circuit board assembly installed within the base member.

To assemble the junction box of FIG. 1, the printed circuit board assembly is completed by installing the shielded modular jacks 90 onto the printed circuit board such that the retention feet 98, the shielding tabs 110, and the terminal interconnection portions 96 respectively engage in apertures 58, 50 and 54 (FIG. 6) of the printed circuit board. The barrel terminals 120 are then installed such that their lower portions extend through apertures 52 in the printed circuit board. The ground clips 70, shown in FIG. 7, are then inserted over the side edge of the printed circuit board such that the resilient fingers 78, 74 each overlie one of the grounding pads 48 on the printed circuit board. The individual printed circuit boards can then be wave soldered such that the grounding clip, the terminals, and the shielded modular jack are all electrically and mechanically soldered to the printed circuit board. The printed circuit board assembly 40 is then insertable into the insulative base member 4 such that the front edge of the printed circuit board 42 is inserted beneath the two support arms 10 of the base member and then the printed circuit board is lowered into a latched relation with latch members 12 of the base member 4, as shown in FIG. 10. In addition to deploying the plurality of shielded modular jacks at the front face of the base member 4, positioning the printed circuit board within the base member 4 disposes a resilient contact portion of each grounding clip in an insulated channel formed by the partitions 18.

The local network outlet 170, shown in FIG. 11, is similarly assembled with the shielded modular jack, the grounding clip 220, and the plurality of barrel terminals 240 installed and electrically interconnected to the printed circuit board 192. Similarly, the printed circuit board assembly is insertable within the insulated housing 172 with two corners of the printed circuit board being insertable beneath the latch plates 178 and moved into latching engagement with the latch arm 180 (FIG. 12). With the network distribution junction box 2 and the local distribution box 170 assembled as described above, the junction box 2 and the local box 170 can be used as a cross-connect system within a data distribution system.

Figure 19:
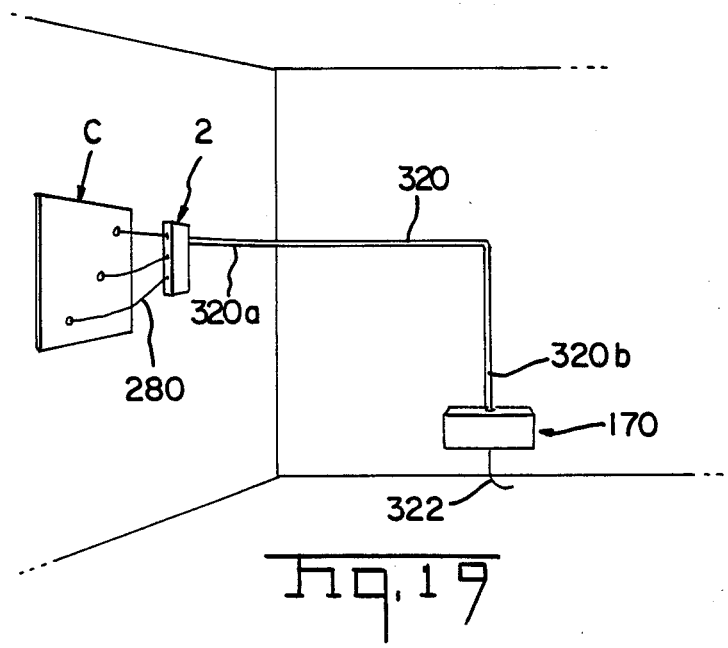
FIG. 19 shows an overall distribution system incorporating the junction box of FIG. 1 and the local outlet of FIG. 11.

As shown in FIG. 19, a local area network concentrator, shown as C, can be disposed within an office complex or building, typically located within an area of the building which is accessible for telephone and network service, which can typically be a wiring closet within the building. Thus, the data distribution junction box 2 could be installed proximate to the local area network concentrator C and could be used as a cross-connect interface with the concentrator. Each shielded modular jack on the printed circuit board could then be interconnected to shielded data cable and could be deployed within the building to various locations and can be terminated to local distribution boxes 170. A computer terminal or other electronic means needing access to the network could then be interconnected to the network via shielded cable and connection system interconnected to the local interface 170.

Figure 14:
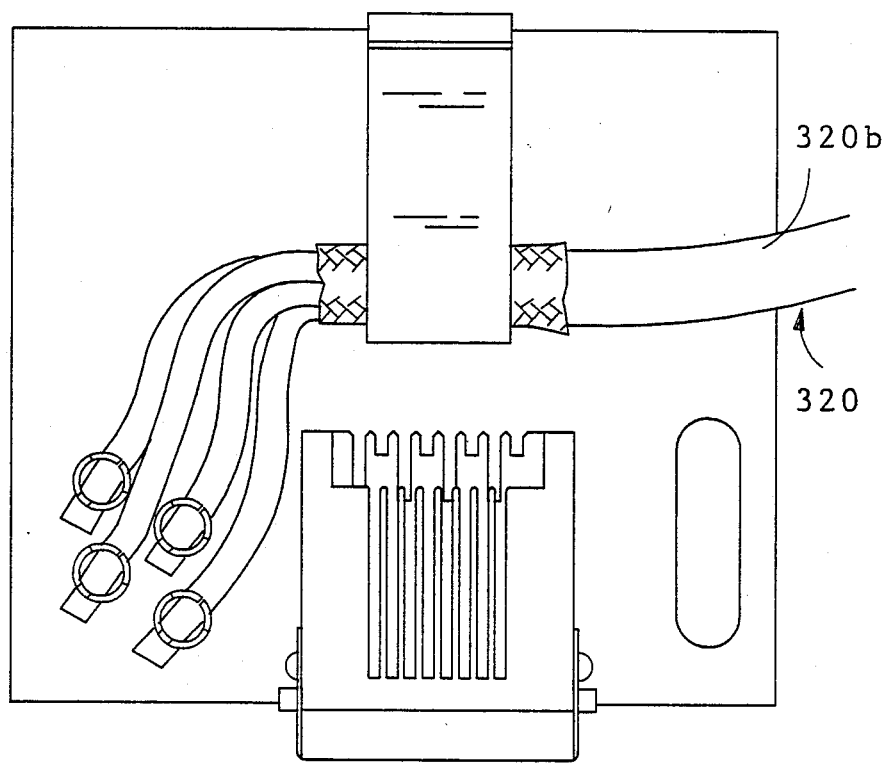
FIG. 14 shows a top plan view of the printed circuit board assembly of FIG. 11, showing a shielded cable terminated thereto.

More specifically, a shielded cable, shown diagrammatically in FIG. 19 as 320, would include ends 320a and 320b. As shown in FIG. 10, a first end 320a would be prepared for termination to the printed circuit board assembly by stripping a portion of the insulation from the cable and dressing the shielding braid back over the insulation. The prepared cable can then be placed within the grounding clip such that the dressed braid is inserted between the resilient arms 80 and 84. Each of the individual conductors can then be dressed to be electrically interconnected within a respective barrel terminal 120 on a printed circuit board assembly. Each electrical position of the printed circuit board assembly is individually interconnected to an end 320a of a shielded data cable and then the cover 130 is placed over the prepared junction box to electrically and mechanically insulate the interior of the junction box. When the cover member 130 is placed over the prepared junction box, each of the cables 320 lies in a respective recess 16 in the rear wall 14 of the insulative base member 4. When the cover member 130 is placed over the base member 4 and fastening means are drawn down to fasten the cover 130 to the base member 4, the recesses 16, 144 and 146 kink the cable to form a strain relief, protecting the individual shielded cables from a tensile force, disconnecting the electrical connection between the printed circuit board assembly. When the data distribution box 2 is fully assembled and installed within the wiring closet, each individual opposite end 320b of the shielded data cable can be deployed to various localities within the building and disposed to various points which require access to the network. At each point which requires access to the network, a local junction box 170 is installed and interconnected to the end 320b of the shielded data cable in a similar manner as described above. The end 320b is prepared by dressing the shielding braid of the data cable 320 over the insulation and terminating each of the individual insulated conductors within one of the barrel terminals 240 installed on the printed circuit board 192, as shown in FIG. 14.

Figure 17:
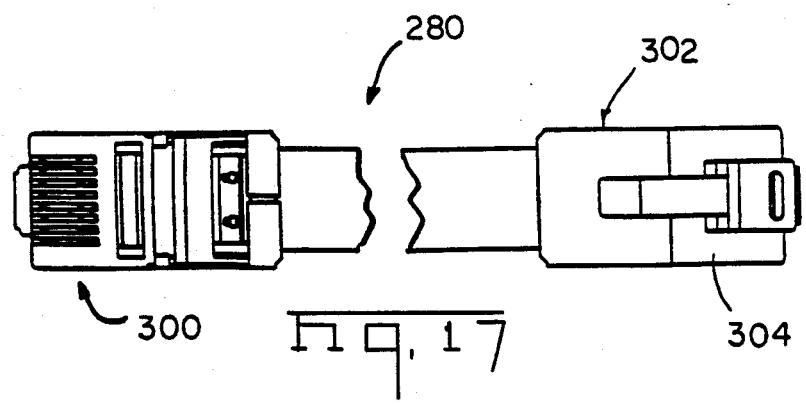
FIG. 17 is a top plan view of a shielded patch cable for use with the data distribution system.
Figure 18:
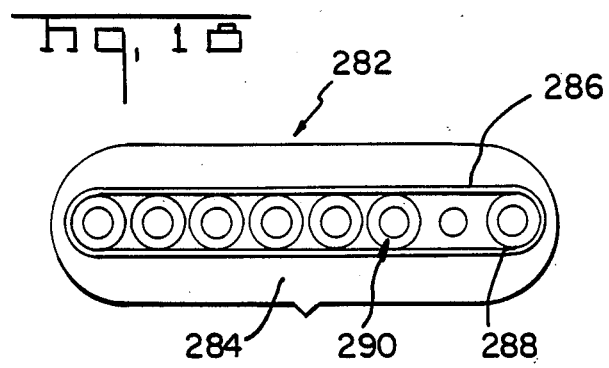
FIG. 18 is a cross-sectional view of the data cable used in the patch cable of FIG. 17.

As shown in FIG. 19, to interconnect various positions of the junction box 2 with the concentrator C, a plurality of jumper cables 280 are required, as shown in FIG. 17, which would include shielded cable 282 similar to that shown in FIG. 18. The shielded cable includes outer insulation 284, insulated conductors having insulation 288 and inner conductors 290, the insulated conducts being surrounded by a shielded member, such as 286. At each jumper cable 280, a modular plug would be electrically interconnected, similar to that shown in U.S. Pat. No. 4,292,736, which would then include an outer shielding member. The outer shielded member of the modular plug would contact the shielding tabs 108 (FIG. 8) upon insertion.

The data distribution assembly 2 (FIG. 1) and the local data distribution assembly 170 (FIG. 11) can be used with speeds up to and including 1 megahertz with the housing members 4, 130 and 172, 250 unshielded. If it is desirable to increase the capabilities of the assemblies, the inner, or outer surfaces could be plated with a conductive material. Otherwise, the housing members 4, 130 and 172, 250 could include stamped and formed metallic members connected to the housing members by such means as heat staking.

We claim:

1. A data distribution network interface for use with shielded data cable having an insulative coating in a surrounding relationship with a plurality of shielded data conductors, the interface comprising:
    an insulative base member having a front face and a rear wire entry face;
    a printed circuit board assembly which is mountable within the base member, the printed circuit board having a front edge which is adjacent to the front face of the base member and a rear edge which is adjacent to the wire entry face, the printed circuit board comprises:
    (i) a plurality of shielded modular jacks positioned on the printed circuit board with plug receiving openings facing towards the front face of the insulative base member, the modular jacks having a plurality of electrical contacts interconnected to the printed circuit board;
    (ii) a plurality of electrical terminals positioned on the printed circuit board and electrically interconnected to respective electrical contacts of the modular jacks via electrical traces which are disposed on the printed circuit board;
    (iii) a plurality of grounding means interconnected to the printed circuit board and electrically interconnected to shields of the shielded modular jacks;
    an insulative cover member positionable over the insulative base member to enclose the printed circuit board assembly.

2. The interface of claim 1 wherein the grounding means comprise resilient clip members which are receivable over the rear edge of the printed circuit board.

3. The interface of claim 2 wherein the printed circuit board includes grounding pads on two sides thereof, such that the grounding clips contact both grounding pads.

4. The interface of claim 1 wherein grounding clips are connected to the printed circuit board at the rear edge thereof, and extend rearwardly towards the wire entry face of the base member.

5. The interface of claim 4 wherein the base member includes partitions which upstand from the base member and extend from a position adjacent to the wire entry face towards the front face, the partitions forming individual channels for receipt of the grounding clips, insulating the grounding clips, one from the other.

6. A data distribution network interface for use with shielded data cable having an insulative coating in a surrounding relationship with a plurality of shielded data conductors, the interface comprising:
an insulative base member having a front face and a wire entry face, and latching and positioning means to position a printed circuit assembly to the base member and latch said printed circuit board assembly thereto;
a printed circuit board assembly which is mountable within the base member including a printed circuit board having a first edge which is adjacent to the front face of the base member and a second edge which includes at least one grounding tab disposed on the printed circuit board which is continuous with a grounding trace which extends towards the first edge of the printed circuit board; at least one shielded modular jack positioned on the printed circuit board with a plug receiving opening of the modular jack facing the front face of the insulative base member, the modular jack having a plurality of electrical contacts interconnected to the printed circuit board and a shield member which is interconnected to the ground trace; a plurality of electrical terminals positioned on the printed circuit board and electrically interconnected to respective electrical contacts of the modular jacks via electrical traces which are disposed on the printed circuit board; grounding means interconnected to the printed circuit board and electrically interconnected to the grounding tab thereby interconnecting the shield member of the modular jack to the grounding means; and
an insulative cover member positionable over the insulative base member to enclose the printed circuit board assembly.

7. The interface of claim 6 wherein the grounding means comprises a grounding clip having a first resilient contact portion which is receivable over the second edge to contact the grounding tab.

8. The interface of claim 7 wherein the grounding means comprises a second resilient contact portion for receiving a shielded data cable therein; whereby, when the shielded data cable is prepared by stripping a portion of the insulation away from an end to be prepared, and a shielding braid of the shielded cable is dressed over the insulation, the prepared end of the cable is insertable into the second resilient contact portion to interconnect the shielding braid of the cable to the shield member of the shielded modular jack.

9. The interface of claim 8 wherein the grounding clip is substantially S-shaped, such that the first resilient contact portion is insertable over the second edge with the second resilient contact portion above the printed circuit board, such that the shielded data cable is insertable in a direction perpendicular to a length of the grounding clip.

10. The interface of claim 8 wherein the second resilient contact portion of the grounding clip includes an upstanding U-shaped member which receives the shielded data cable in a direction parallel to that of a length of the terminal.

11. A data distribution interface for use with shielded data cable having insulation surrounding a plurality of shielded data conductors, the interface comprising a printed circuit board assembly including a printed circuit board having a first and a second edge, and at least one grounding trace disposed on the printed circuit board and emanating from a position proximate the first said edge, and extending towards the second said edge and forming a grounding tab; a plurality of electrical traces which emanate from a position proximate the first said edge and extending towards a terminal receiving area; a plurality of electrical terminals positioned on the printed circuit board in the terminal receiving area and electrically interconnected to respective electrical traces; at least one shielded modular jack positioned on the printed circuit board with a plug receiving opening of the modular jack facing outwardly, the modular jack having a plurality of electrical contacts interconnected to portions of the electrical traces proximate the first said edge and a shield member which is interconnected to the ground trace; and a grounding clip having a first resilient contact portion to interconnect the grounding clip to the printed circuit board grounding tab and a second resilient contact portion to resiliently retain the shielded data cable.

12. The interface of claim 11 wherein the shield member includes integral tabs which extend downwardly to interconnect to the grounding trace.

* * * * *